United States Patent [19]

Allen et al.

[11] Patent Number: 5,497,332
[45] Date of Patent: Mar. 5, 1996

US005497332A

[54] METHOD AND APPARATUS FOR METERING AND MONITORING AC GENERATORS

[75] Inventors: Charles R. Allen; Robert L. Spaw, both of Houston, Tex.

[73] Assignee: Automatic Terminal Information Systems, Inc., Houston, Tex.

[21] Appl. No.: 130,437

[22] Filed: Oct. 1, 1993

[51] Int. Cl.⁶ .......................... G01R 19/00; G01R 21/00; G01R 21/06
[52] U.S. Cl. .......................... 364/483; 364/492; 364/494
[58] Field of Search ...................... 364/483, 480, 364/492, 494; 363/71, 40; 318/701, 138, 599; 322/20, 21, 14; 290/40 R; 361/20, 21; 307/57, 84, 85, 86, 87, 125, 126, 130, 131, 153

[56] References Cited

U.S. PATENT DOCUMENTS

| | | | |
|---|---|---|---|
| 3,564,273 | 2/1971 | Cockrell | 290/40 R |
| 4,077,061 | 2/1978 | Johnston et al. | 364/483 |
| 4,456,865 | 6/1984 | Robertson, Jr. et al. | 318/599 |
| 4,477,765 | 10/1984 | Glennon et al. | 322/20 |
| 4,661,756 | 4/1987 | Murphy et al. | 318/701 |
| 4,713,608 | 12/1987 | Catiller et al. | 364/483 |
| 4,989,155 | 1/1991 | Begin et al. | 364/483 |
| 5,117,174 | 5/1992 | Kessler | 322/21 |
| 5,132,610 | 7/1992 | Ying-Chang | 364/483 X |
| 5,231,344 | 7/1993 | Marumoto et al. | 322/14 |
| 5,315,533 | 5/1994 | Stich et al. | 364/480 |
| 5,351,180 | 9/1994 | Brennen et al. | 363/71 |

*Primary Examiner*—Emanuel T. Voeltz
*Assistant Examiner*—M. Kemper
*Attorney, Agent, or Firm*—Michael P. Breston

[57] ABSTRACT

This invention involves transducing and monitoring the power being delivered by an electric generator to a power bus by using a monitor which includes an embedded microprocessor in the memory of which are stored reference digital numbers that correspond to the generator's nominal power, and to the components of the nominal power including output power. The generator's voltage and current signals are sensed and then shaped for use by the microprocessor wherein they are digitized into a first set of digital numbers. Preferably, the first set of digital numbers is converted into pulse-width modulated (PWM) square-wave signals, which are demodulated into DC current signals that are indicative of the power and the components of power being delivered by the electric generator to its power bus. The microprocessor digitizes the square wave signals into a second set of digital numbers, and calculates from the first and from the second sets of digital numbers real time digital numbers. Preferably a microcontroller is also embedded with the microprocessor to compare the calculated real time digital numbers with their corresponding reference digital numbers and to generate control signals to selectively actuate circuit breakers which interconnect the generator and its loads to the power bus.

10 Claims, 4 Drawing Sheets

METHOD AND APPARATUS FOR METERING AND MONITORING AC GENERATORS

BACKGROUND OF THE INVENTION

This invention relates in general to a method and apparatus for transducing and monitoring the performance of generator units, which may be DC or AC generators, either single phase or polyphase, as well as for controlling the loads connected thereto.

While the general principles and teachings herein are applicable to all types of generators, the invention will be described in detail for use with 3-phase power generators that are widely used in small electric power plants, as in hospitals, offshore platforms, ships, etc., and in remote areas where commercial power is not available, or in emergency situations when commercial power is temporarily disrupted.

In use, such AC power generators are subjected to frequent large power surges, voltage and current overloads, and fluctuations in the Dower factor, as machinery is switched ON or OFF.

Also, because two or more generators are normally connected in parallel, when one generator's prime mover unexpectedly shuts down, all of the small plant's electrical loads, and the motoring effects of the failing generator, will be suddenly transferred to the surviving generators. This is known as the "reverse power" condition, as distinguished from the "normal" or "forward" power condition, when all the generators produce electricity.

A reverse power condition often produces a steep load increase on the surviving generator, say 50% of its rated load, resulting in a shutdown within 500 ms due to either under speed or over temperature of the engine driving the surviving generator. Other frequently encountered and potentially harmful conditions to all systems connected to the power bus, include under or over voltage, under or over frequency, and over current with under frequency (fault current) at the same time.

While this invention has wide applications for military as well as civilian users, it will be described for use by the U.S. Defense Department on ships, such as destroyers, battleships, aircraft carriers, etc., primarily because that use is well documented, regulated and critical.

Such military applications have stringent requirements, as specified in military spec MIL-M-24350B(SH) of Jul. 31, 1989, as subsequently amended, (hereinafter "the MIL spec").

This MIL spec requires that reverse power monitoring, such as a reverse power relay (RPR), when mounted in a generator control unit, sense a power reversal on a 60 Hz, 3-phase generator in time to trip a circuit breaker for removing the motorized generator from the power bus to prevent overloading the surviving generator's prime mover.

The Mil spec also requires that the over-power monitor, such as an over-power relay (OPR), sense a high power demand and provide, if required, two or more successive, critically-timed load sheddings by tripping selected load circuit breakers for the purpose of reducing the temporary excessive high power demand, thereby protecting both the generator that is carrying the load and its prime mover.

The current sensing signals used by OPRs and RPR's are supplied by current transformers (CT) which see usually only 80% of CT rating at full generator rated output. Examples are 5000/5 ratio CTs used for 2500 kW 4000 amp generators, and 4000/5 ratio CTs used for 2000 kW 3200 amp generators. The CTs are used to drive switchboard 0-5 amp meter movements and remote panel meters which allow for reading over-current conditions rather than "peg out" at generator rating.

Additionally, a different type of RPR must be used depending on the type of prime mover involved, i.e., Diesel, steam turbine, or gas turbine.

These requirements make it difficult to adjust the ship generators trip levels, since each type of generator requires different types of OPRs and RPRs, and different types of reverse-power metering and trip timing intervals.

This great diversity of requirements was met in the prior art by providing a wide range of transducers, meters, test equipments, and power monitor instruments. Hence, the U.S. Defense Department had to maintain, at strategic locations around the world, costly inventory to meet the diverse needs of its different ship classes. In addition, skilled technicians on military ships had to periodically test their transducers, meters and power monitor instruments against standards available only in a shipyard or port.

It is a general object of this invention to use a digital monitor and controller for transducing and monitoring the performance of DC or AC generator units, as well as for controlling the loads connected thereto in small power plants especially on ships.

SUMMARY OF THE INVENTION

This invention uses a method and apparatus for transducing and monitoring the power being delivered by an electric generator unit to a power bus. In its simplest form, the invention uses a monitor which includes a microprocessor. In the memory of the microprocessor are stored reference digital numbers which correspond to the generator's nominal power, and to the components of the nominal power including output power.

The voltage and current signals are sensed on the power bus. The sensed voltage and current signals are shifted, band limited, and attenuated into shaped voltage and current signals and then they are digitized and converted into modulated signals.

The modulated signals are converted into signals which correspond to the power and the components of power being delivered by the electric generator to its loads.

Preferably, the shaped voltage and current signals are digitized and converted into pulse-width modulated (PWM) square-wave signals, which are then converted into isolated DC current signals that correspond to the power and the components of power being delivered by the electric generator to its loads.

If the sensed voltage and current signals are AC signals, the sensed AC voltage and current signals are shifted, band limited, and attenuated into shaped AC voltage and current signals, which are then converted into shaped square wave signals that contain information on the sensed AC voltage and current signals on the power bus.

In its general form, the invention uses a monitor which includes an embedded microprocessor and microcontroller to digitize the shaped square wave signals and (1) to associate the digitized shaped AC voltage and current numbers with the shaped square wave signals, and (2) to arithmetically calculate, under the guidance of mathematical functions and the software stored in the monitor's memory, real time digital numbers which are indicative of the generator's power, and components of power.

The calculated real time digital numbers are compared with their corresponding reference digital numbers stored in the monitor's memory, and the results of the comparisons are monitored. Whenever the calculated digital numbers exceed the corresponding stored reference digital numbers by specified amounts for more than specified time intervals, appropriate control signals are produced to selectively actuate circuit breakers which tie the power bus to the generator.

DETAILED DESCRIPTION OF PREFERRED EMBODIMENTS

Figure 1:
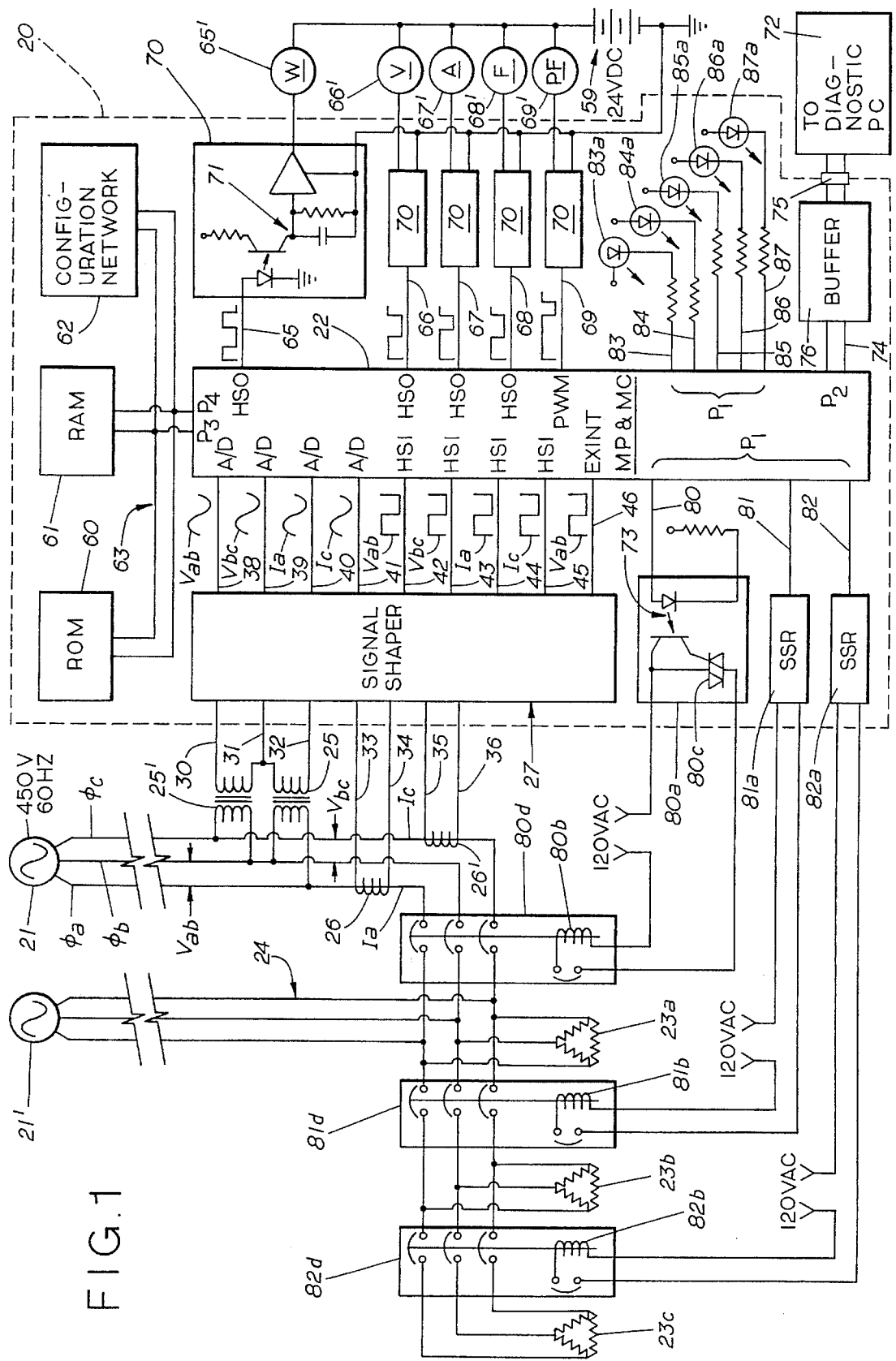
FIG. 1 is a schematic block diagram of a preferred embodiment of the monitor and controller of the invention showing it connected to AC generators and their loads.

The preferred embodiment of the transducer, monitor and controller of this invent ion, hereinafter the monitor generally designated as 20 (FIG. 1). Monitor 20 is designed for use with any type ship power plant typically having a pair of 3-phase AC power generators 21,21' connected in parallel. Each generator is selected for a specific class ship, such as a destroyer, battleship, aircraft carrier, etc. Each generator requires its own monitor 20.

Monitor 20 is very compact. It uses an integrated embedded microprocessor and microcontroller (P&C) 22 on a single chip, such as Intel's chip MCS-96™ and, more specifically, the member of MCS-96 family designated as 80196KB, which has 68 pins, analog-and-digital I/O, a 16-bit CPU, register-to-register architecture, eight A/D input channels (10-bit conversion), pulse-width-modulation (PWM) outputs with programmable duty cycle for motor control and D/A conversion, five 8-pin I/O ports and one with alternate function capability, and a full duplex serial communications port capable of implementing I/O port expansions. Its versatile A/D inputs (22 microsecond conversion time, sample and hold) and D/A pulse width modulated (PWM) outputs allow for efficient onchip signal processing, motor and closed loop control. Chips with equivalent features and capabilities to the 80196KB chip are available also from vendors other than Intel.

P&C 22 is characterized by (1) its special function registers through which efficient control of all I/O operations or monitoring is accomplished, (2) its versatile interrupt system, which makes possible the transparent execution of a large number of related or unrelated tasks, (3) its ultra-fast independent high-speed input/output (HSI/O) unit, and (4) its powerful instruction features.

The two generators 21,21' feed power to floating 3-phase, delta-connected 450V loads 23a, 23b and 23c through a power bus 24 having phases A, B and C. It will be understood that a Y-connected load (not shown) can be used as well, by making suitable programming and hardware modifications to monitor 20.

Monitor 20 senses voltage $V_{ab}$, between phase lines A and B of power bus 24, with potential transformer (PT) 25. It senses voltage $V_{bc}$, between phase lines B and C, with potential transformer 25'. Each PT has a 4:1 stepdown. The voltage level from each PT will vary from 110 to 120 volts. This level has a voltage spike of 1000 volts on top of the normal voltage signal level. Monitor 20 also senses current signals $I_a$ and $I_c$ in phase lines A and C with current transformers (CT) 26 and 26', respectively.

Figure 2:
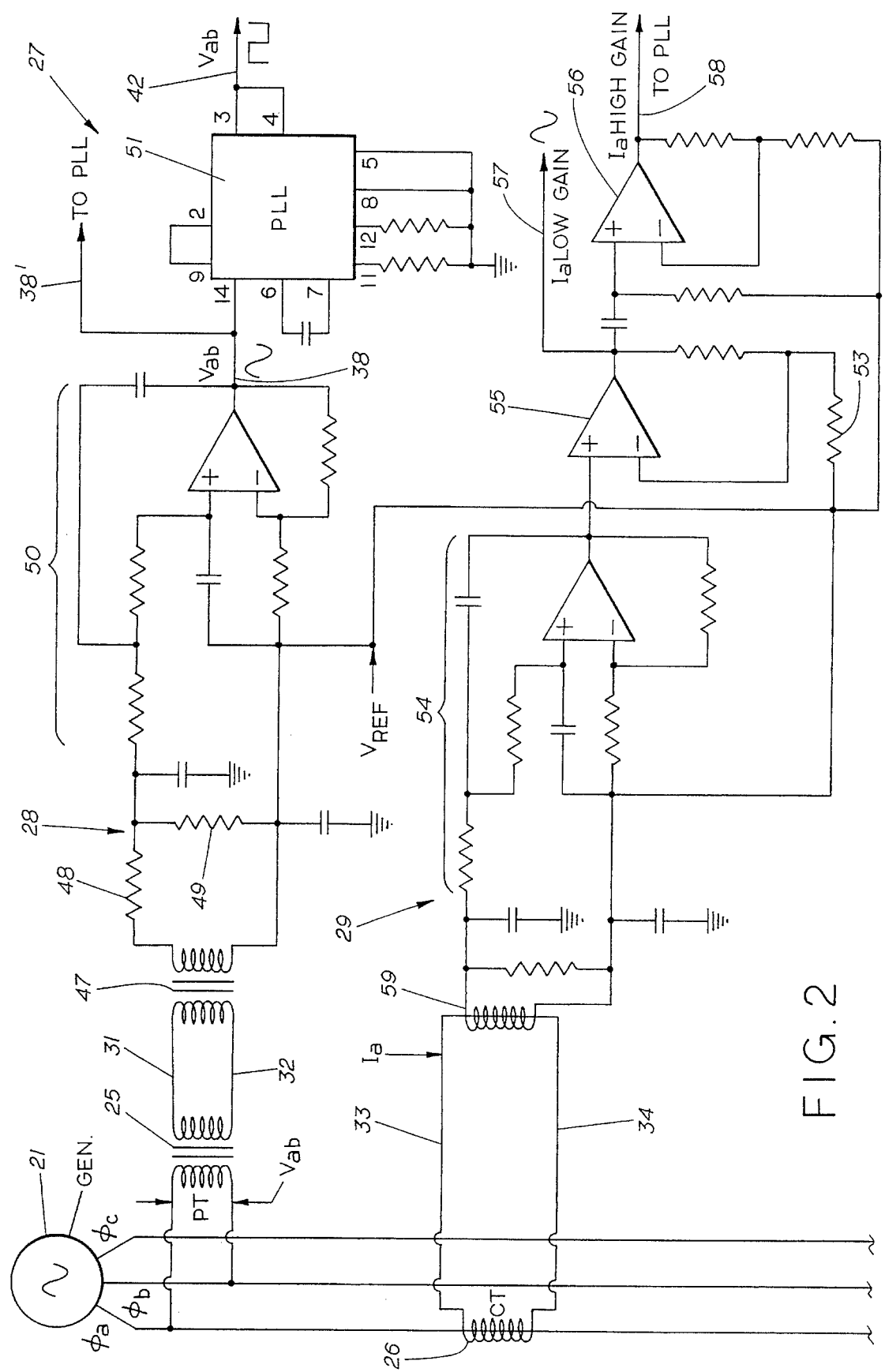
FIG. 2 shows a typical voltage channel and a typical current channel within the signal shaper.

The PTs 25,25' and CTs 26,26' couple lines A,C to a signal shaper 27 (FIGS. 1,2), which has two identical voltage channels 28, two identical current channels 29, and inputs 30–36. To simplify the drawings, only one such voltage channel 28 and one such current channel 29 are shown in FIG. 2. The output signal $V_{ab}$ from PT 25 is applied to lines 31,32, and the output signal $V_{bc}$ from PT 25' is applied to lines 30,31. The output current $I_a$ from CT 26 flows between lines 33,34 and the output current $I_c$ from CT 26' flows between lines 35,36.

Signal shaper 27 is linked with the analog-to-digital (A/D) converters inside P&C 22 through lines 38–41, with its high-speed-inputs (HSI) through lines 42–45, and with its external interrupt (EXINT) through line 46. In the drawings, for simplicity the same reference characters 38–46 designate the lines and the respective signals 38–46 thereon. In general, whenever possible, the reference characters to lines will be used interchangeably to designate the respective signals thereon to facilitate the description.

In signal shaper 27, voltage channel 28 (FIGS. 1,2) receives voltage signal $V_{ab}$ from PT 25. Current channel 29 receives current signal $I_a$ from CT 26. The identical other voltage channel 28 (not shown) receives voltage signal $V_{bc}$ from PT 25', and the identical current channel 29 (not shown) receives current signal $I_c$ from CT 26'.

Signal shaper 27 shifts, band limits, and attenuates the received voltage signals $V_{ab}$,$V_{bc}$ and current signals $I_a$,$I_c$ on input lines 30–36 and puts out attenuated, sinusoidal voltage waves $V_{ab}$,$V_{bc}$ on lines 38,39, and sinusoidal current waves $I_a$,$I_c$ on lines 40,41 whose levels are readable by P&C 22.

In signal shaper 27, phase-locked loops (PLL) 51 output square wave signals 42–46 which contain information on the phases of voltage signals $V_{ab}$ and $V_{bc}$ and current signals $I_a$ and $I_c$ that are being monitored by PTs 25,25' and CTs 26,26', respectively.

P&C 22 uses square wave signals 42–45 which contain information on the power factor direction and frequency. Another PLL (not shown) outputs a square wave signal $V_{ab}$ on line 46 whose frequency is 16 times greater than the frequency of voltage $V_{ab}$ on power bus 24. Signal $V_{ab}$ on line 46 is applied to EXINT of P&C 22 for controlling the sampling rate of its A/D converters.

More specifically, with reference to FIG. 2, a PT 47 receives voltage signal $V_{ab}$ from PT 25 and outputs a stepped down voltage $V_{ab}$ on line 42 needed by P&C 22. Op-amp circuit 50 is a low-pass filter having a 350 Hz cutoff frequency to limit noise on voltage signal $V_{ab}$ before it appears on output line 38. Resistors 48,49 set the gain of voltage channel 28, so that signal 38 achieves 5 volt peak-to-peak for a 150 volt RMS input to transformer 47.

From op-amp circuit 50 signal $V_{ab}$ is passed through a phase-locked loop (PLL) 51, which is a generic CMOS 4046 chip, described on pages 6–120 through 124 in Motorola's 1988 CMOS LOGIC DATA book. PLL 51 has pin connections 2–9, 11–12 and 14. The idle frequency of PLL 51 is about 60 Hz. Its lock range is approximately between 30–70 Hz to filter out any distortion from sinusoidal signal $V_{ab}$ on line 38 and to output a square wave $V_{ab}$ on line 42 whose frequency is the same as the fundamental 60 Hz frequency on power bus 24. Signal 42 has a constant phase relationship with the power bus voltage $V_{ab}$. Because square wave signal 42 has sharp axis crossings, accurate timing can be obtained from the voltage and current phase differences being monitored.

The sinusoidal signal $V_{ab}$ from op-amp circuit 50 is applied through line 38' to another PLL (not shown) which is similar to PLL 51 but which has in addition a 16:1 divider in its feedback loop between pins 3–4. This divider has the effect of producing a square wave signal 46 whose frequency is larger than the frequency of square wave signal 42 by a factor of 16.

The sinusoidal voltage signal $V_{bc}$ on line 39 and the square wave signal $V_{bc}$ on line 43 are obtained from the voltage channel 28 (not shown) in an identical manner as described in connection with signals 38 and 42.

In current channel 29 of signal shaper 27, a CT 59 receives sinusoidal current signal $I_a$ from CT 26. Resistor 53 sets the gain of channel 29. Op-amp circuit 54 is a low-pass filter having the same parameters as those of op-amp circuit 50. Additional gain is provided by gain stages 55,56.

Both the low-gain sinusoidal signal $I_a$ on line 57 from gain stage 55, and the high-gain sinusoidal signal $I_a$ on line 58 from gain stage 56, are combined as sinusoidal signal $I_a$ on line 40 (FIG. 1). But, high-gain signal $I_a$ on line 58 is used only as long it is sinusoidal.

When the amplitude of current signal $I_a$ from CT 26 becomes sufficiently high, current signal $I_a$ on line 58 will be clipped, and P&C 22 will automatically switch to the low-gain current signal $I_a$ on line 57 for carrying out the necessary computer calculations.

The total gain of current channel 29 is selected so that clipping of high-gain current signal $I_a$ on line 58 will start with a 1 amp output current from CT 26. Signal $I_a$ on line 57 will clip at 8 amps. Signal $I_a$ on line 58 is applied to a PLL identical to PLL 51 to produce the square wave current signal $I_a$ on line 44 (FIG. 1).

The sinusoidal current signal $I_c$ on line 41 and the square wave signal $I_c$ on line 45 are obtained from the current channel 29 (not shown), in an identical manner as described in connection with current signals 40 and 44.

Ports P3 and P4 of P&C 22 (FIG. 1) are connected to read-only-memory (ROM) 60, to random-access-memory (RAM) 61, and to the ship's configuration network 62 through an address/data bus 63.

P&C 22 also digitizes the shaped analog signals 38–41 from signal shaper 27, thereby producing a first set of digital numbers, which are then used by the software program in ROM 60 to calculate the generator's average RMS voltage and its average RMS current values, as well as its average power and its power factor.

Voltage signals 38,39 and current signals 40,41 from signal shaper 27 are digitized by the internal analog-to-digital (A/D) converters of P&C 22, which produces pulse-width-modulated (PWM) square-wave signals 65–68 at its high-speed outputs (HSO), and a PWM square wave signal 69 at its PWM output. HSO signals 65–68 operate at 90 HZ. The PWM signal 69 operates at 12 KHz. PWM signals 65–68 are proportional to input signals 38–45. An input of zero (0) is a 20% duty cycle. An input of full scale is a 95% duty cycle.

The average power measurement process is a very important aspect of this invention.

When signal 46 EXINT goes high, sixteen times during each power bus voltage cycle, instantaneous voltages $V_{ab}$, $V_{bc}$ and currents $I_a, I_c$ in phases A and C are measured. These measured values are multiplied and then averaged over several voltage cycles to produce the desired average power, the magnitude of the power factor, the average RMS voltage $V_{rms}$, and the average RMS current $I_{rms}$.

The instantaneous powers are calculated using equations (1) and (2):

$$p_a = i_a v_{ab} \quad (1)$$

$$p_c = i_c v_{bc} \quad (2)$$

where:
$p_a$=instantaneous power in phase A,
$p_c$=instantaneous power in phase C,
$i_a$=instantaneous current in phase A,
$i_c$=instantaneous current in phase C,
$v_{ab}$=instantaneous voltage between phases A and B, and
$v_{bc}$=instantaneous voltage between phases B and C Average power is then calculated using equation (3):

$$P_{av} = \frac{\Sigma P_a}{X} + \frac{\Sigma P_c}{X} \quad (3)$$

where:
$P_{av}$ is the average power, and
X=the number of samples used in calculating $P_{av}$, which is typically 16.

The generator's power is forward generating if $P_{av}$ is positive. If $P_{av}$ is negative, the power is reverse generating, i.e., motoring.

The average RMS voltage is calculated using equation (4):

$$V_{rms} = \frac{\sqrt{\frac{\Sigma v_{ab}^2}{16}} + \sqrt{\frac{\Sigma v_{bc}^2}{16}}}{2} \quad (4)$$

where:
$\Sigma v_{ab}^2$=the sum of the squares of 16 instantaneous A/D conversions of $V_{ab}$ on line 38, and
$\Sigma v_{bc}^2$=the sum of the squares of 16 instantaneous A/D conversions of $V_{bc}$ on line 39.

The average RMS current is calculated using equation (5):

$$I_{rms} = \frac{\sqrt{\frac{\Sigma i_a^2}{16}} + \sqrt{\frac{\Sigma i_c^2}{16}}}{2} \quad (5)$$

where:
$\Sigma i_a^2$=the sum of the squares of 16 instantaneous A/D conversions of $I_a$ on line 40, and
$\Sigma i_c^2$=the sum of the squares of 16 instantaneous A/D conversions of $I_c$ on line 41.

Frequency is calculated using equation (6):

$$f = \frac{1}{\Delta T} \quad (6)$$

where: $\Delta T$ is the time interval between two 0 to 5 v transitions of $V_{ab}$ on line 42.

The magnitude of the power factor (pf) is calculated using equation (7):

$$pf = \frac{P_{av}}{\sqrt{3} \; V_{rms} \times I_{rms}} \quad (7)$$

where: $V_{rms}$ and $I_{rms}$ have RMS voltage and current values, respectively.

P&C 22 digitizes square wave signals 42–45 to produce a second set of digital numbers which contain information on power factor direction and frequency. Whether the power factor pf is leading or lagging is determined by measuring the timing between voltage waveforms $V_{ab}$ and $V_{bc}$ on lines 42,43 and current waveforms $I_a$ and $I_c$ on lines 44,45. Power factor pf is leading if current signals 44,45 lead voltage signals 42,43. Conversely, pf is lagging if current signals 44,45 lag voltage signals 42,43. Signal 44 is compared by P&C 22 to signal 42, and signal 45 is compared to signal 43.

The square-wave PWM signals 65–69 from P&C 22 (FIG. 1) are converted by five distinct opto-coupler (OC) networks 70, which are energized by an external 24V DC power source 59. Networks 70 are opto-isolated from ground and from each other.

Each one of the five PWM square wave signals 65–69 is passed through a corresponding opto-coupler network 70, only one of which is shown in detail in (FIG. 1).

During normal operation, or when power returns to normal expected levels, monitor 20 operates as a transducer. Each OC network 70 includes a filter circuit 71, which converts its received (PWM) signal into a distinct, isolated, industry-standard 4–20 ma DC current signal flowing through its corresponding current meter in its corresponding DC circuit.

The five currents flowing in the five DC circuits are proportional to the generator's power W in Kw, average RMS voltage V in volts, average RMS current A in amps, power factor (pf), and frequency f in Hz, and are measured by five distinct current meters 65'–69', respectively.

Each 4–20 ma DC current signal is the result of digital calculations and its amplitude can be read off directly from one of the meters 65'–69', or it can be monitored remotely by adding additional meters (not shown) in its current loop.

P&C 22 communicates with personal computer (PC) 72 through serial port P2 in a RS 232 configuration. Port P2 has a DB9-type connector 75 whose output lines are buffered into a standard buffer chip 76, such as a LT1080, as described on pages 10–43 through 50 of Linear Technology's 1990 LINEAR BOOK. The output lines from buffer 76 can communicate with computer 72 locally or at a remote location.

Also, from the keyboard of PC 72 diagnostics and testing can be carried out on the power plant's generators 21, on monitor 20, and on all circuits connected thereto, thereby eliminating the need for periodically testing against standards, as well as the need for arrays of transducers, meters, test equipments, and power monitor instruments, now available only in shipyards, as more fully described in the background sect ion above.

The calculated digital number values from equations 1 through 6 are used by P&C 22 to monitor the reverse power, over power, under and over voltage, under or over frequency, over current and/or any combinations thereof, and to control the loads connected to the AC power generator units 21,21', as will now be described.

Bi-directional port P1 of P&C 22 outputs digital control signals on its eight low-active lines 80–87. The digital control signals on lines 80–82 are used to activate identical solid state relays (SSR) 80a–82a which can trip circuit breaker coils 80b–82b, respectively. Each SSR uses the same high-noise immunity, silicon-controlled rectifier (SCR) 80c and the same opto-coupler circuit 73. The high-noise immunity is required to prevent false tripping of the circuit breakers 80d–82d.

The shunt trip coils 80b–82b will trip, when activated, circuit breakers 80d–82d, respectively. During an overload of generator 21 when $P_{av}$ is above the set point called for by OPR level switch 98 (FIG. 4), the shunt trip coil 82b will trip circuit breaker 82d that attaches a first non-essential load 23c to power bus 24.

If the overload condition still persists, after the time delay set by OPR variable time switches 98, the shunt trip coil 81b (FIG. 1) will trip circuit breaker 81d that attaches a second non-essential load 23b to power bus 24. Additional load-sheddings can be added by making software and hardware modifications.

During a loss of power to the prime mover (not shown) of generator 21, or during an under or over voltage, under or over frequency, over current and/or any combinations thereof, shunt trip coil 80b will trip the main circuit breaker, or bus tie 80d, which has the effect of removing generator 21 from power bus 24.

This load shedding procedure can be inhibited when the line voltage frequency is above a certain frequency, say 59 Hz.

The time delays and frequency inhibits are desirable to prevent the shedding of a load under momentary overload conditions that are not expected to be detrimental to power generator 21. The time delays must take into account the response time for each application, which is defined as the time period from the onset of an event until the required action has been initiated. This includes detection time, internal circuit reaction time, and the turn-on time for one of the solid state relays (SSR) 80a–82a which initiates the circuit breaker tripping. It does not include the time it takes a circuit breaker 80d–82d to open after its trip coil 80b–82b has been energized.

Figure 4:
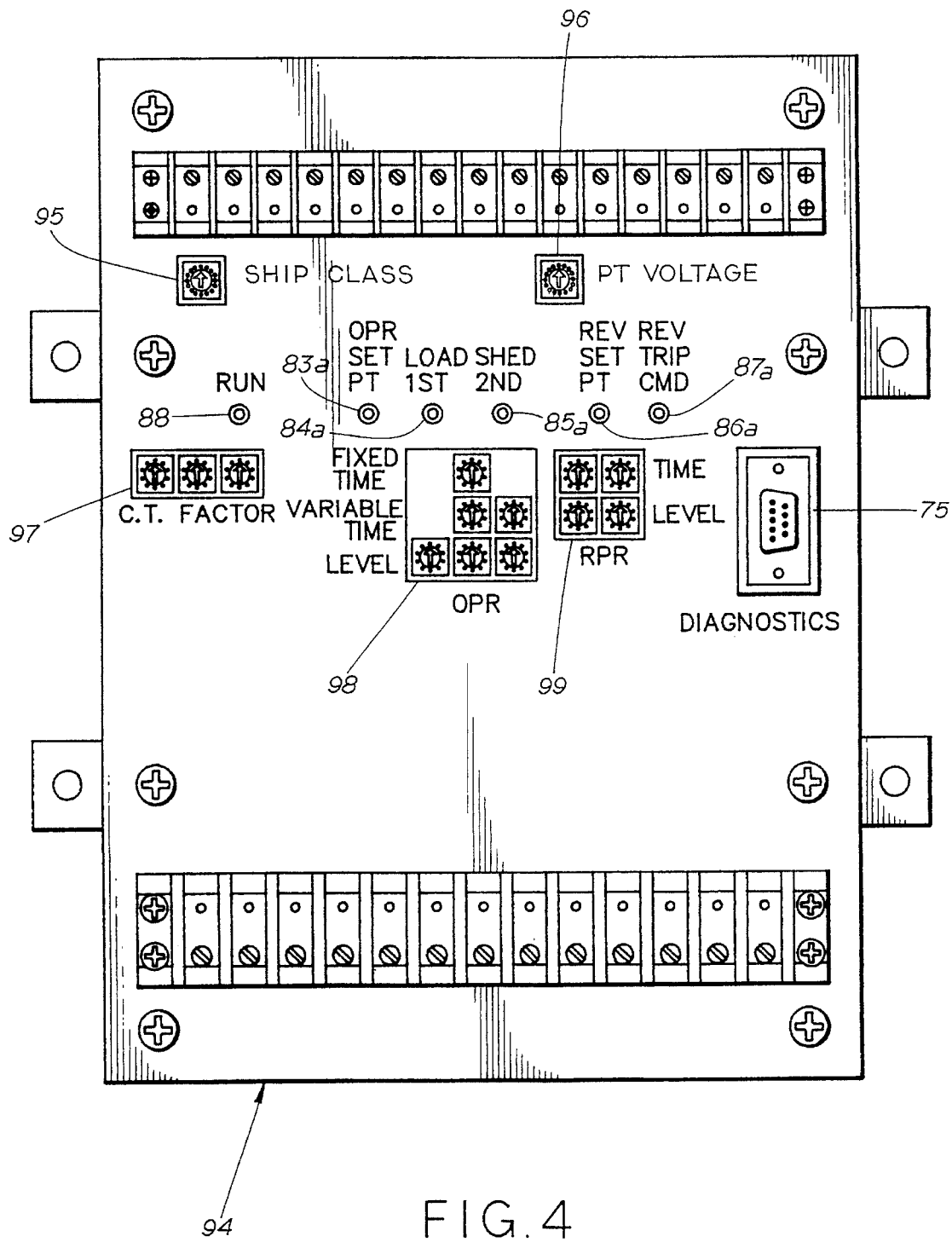
FIG. 4 shows the monitor's housing with its access cover removed to reveal the configuration switches contained in the configuration network shown in FIG. 1.

The output control signals from P&C 22 on lines 83–87 are used to turn on light-emitting diodes (LED) 83a–87a, respectively, which provide visual indications of the tripped conditions of circuit breakers 80d–82d, or that setpoints have been reached, hence that a particular load or loads have been shed, as indicated by the notations placed above each LED (FIG. 4). In addition, a control signal (not shown) on port P2 is used to turn on LED 88 which provides a visual indication that monitor 20 is running properly.

Monitor 20 can readily reconfigure by the use of configuration network 62 (FIG. 1), which includes several identical binary coded rotary configuration switches, generally designated as 91 (FIG. 1), such as are described on pages 15–19 of August's 1988 Alcoswitch catalog.

The ship's configuration is set by configuration switches 91, each representing a mechanical read-only-memory (ROM) that occupies a small amount of memory address space. Each switch 91 is read lust like an electronic ROM, even though it functions as a mechanical ROM. Switches 91 direct the software to a particular location in ROM 60 wherein the generator's configuration information is stored.

Figure 3:
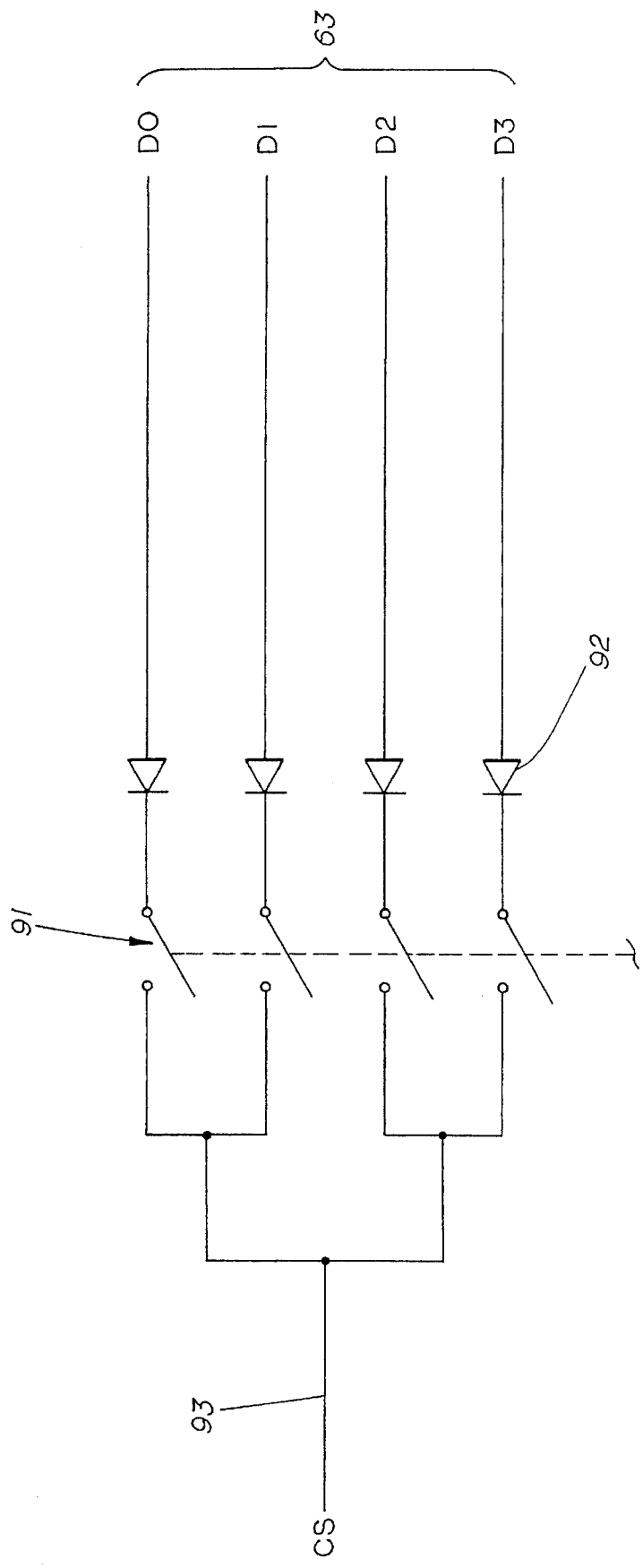
FIG. 3 shows a typical configuration switch circuit within the configuration network.

FIG. 3 shows only one such configuration switch circuit 91. Switches 91 are connected through diodes 92 to address/data bus 63. The chip select (CS) signals on line 93 are active low. When a particular switch 91 is selected, its closed or open condition is represented by a pattern of digital 1s and 0s on address/data bus 63.

FIG. 4 shows the housing 94 of monitor 20 with its access cover plate removed so as to reveal the configuration switches 91. Ship class switch 95 configures the software to function properly for a particular ship class and its type of generators and their prime movers. PT voltage switch 96 makes adjustments to correct for deviations in the full rated voltage, such as 440, 450, 460, 470 or 480 volts, on generators 21.

CT factor switches 97 make adjustments in the current transformers' factors (CTF).

CTF is calculated using equation (8):

$$CTF = \frac{CT \text{ current rating of the primary transformer 26}}{\text{full load current rating of generator 21 at unity power factor.}} \quad (8)$$

Over-power-relay (OPR) switches 98 adjust the over-power trip point and the time delays between the reaching of a trip point and the actual trip of a load shedding relay. RPR switches 99 adjust the reverse power trip point and the time delay between the reaching of the trip point and the actual trip of the bus tie breaker 80*d*.

Hence, monitor 20 monitors the first and the second sets of digital numbers, which correspond to the generator's power output and the components of the power. Under instructions from the software stored in ROM 70, when these digital numbers exceed predetermined set point values, monitor 20 will generate control signals.

These control signals are effective to initiate tripping, in a timely fashion, of appropriate circuit breakers to provide, as may be required, one or more successive load sheddings, thereby reducing a temporary excessive high power demand, and protecting all systems connected to the power bus against large power surges, reverse power, current overloads, fluctuations in frequency and voltage, and, if required, breaking the tie between generator 21 and its power bus 24.

Monitor 20 therefore satisfies the great diversity of end user requirements, without having to employ a wide range of specific transducers, meters, and power monitor instruments, such as RPRs, OPRs.

P&C 22 TASKS OVERVIEW

I. Electrical Measurements

A. Take sample 1 out of 16 samples at time $T_1$, which is the first transition from low to high on line 46;
 1. digitally measure voltage $v_{ab}$ on line 38,
 2. digitally measure current $i_a$ on line 40,
 3. multiply $(v_{ab}i_a)$ and save results as $p_a$,
 4. digitally measure voltage $v_{bc}$ on line 39,
 5. digitally measure current $i_c$ on line 41,
 6. multiply $(v_{bc}i_c)$ and save results as $P_c$,
 7. square $v_{ab}$ and save $v_{ab}^2$,
 8. square $v_{bc}$ and save $v_{bc}^2$,
 9. square $i_a$ and save $i_a^2$,
 10. square $i_c$ and save $i_c^2$.

B. At times $T_2$ through $T_{16}$ take samples 2–16:
Repeat steps A1 through A10 for each sample taken.

C. Averaging:
 1. sum all $p_a$ samples for one cycle, divide by 16, and save mean value of $P_a$,
 2. sum all $p_c$ samples for one cycle, divide by 16, and save mean $p_c$,
 3. add mean values of $(P_a+P_c)$ and save in register the value of $P_{av}$,
 4. sum all $v_{ab}^2$ values for one cycle, divide by 16, and save mean $V_{ab}^2$,
 5. sum all $v_{bc}^2$ values for one cycle, divide by 16, and save mean $V_{bc}^2$,
 6. sum $i_a^2$ values for one cycle, divide by 16, and save mean $I_a^2$,
 7. sum all $i_c^2$ values for one cycle, divide by 16, and save mean $I_c^2$,
 8. take square root of $V_{ab}^2$ and save RMS value $V_{ab}$,
 9. take square root of $V_{bc}^2$ and save RMS value $V_{bc}$,
 10. average $(V_{ab}+V_{bc})/2$ and save as $V_{rms}$,
 11. take square root of $I_a^2$ and save RMS value $I_a$,
 12. take square root of $I_c^2$ and save RMS value $I_c$, and
 13. average $(I_a+I_c)/2$ and save as $I_{rms}$ D. Frequency Measurements
 1. read timer when voltage waveform $V_{ab}$ 42 goes positive and save as $T_{17}$,
 2. read timer again after another positive transition, and save as $T_{18}$,
 3. subtract $T_{17}$ from $T_{18}$ and save as $T_{19}$, and
 4. convert $T_{19}$ to frequency f.

E. Power factor Measurement and Calculation
 1. read time between waveforms $V_{ab}$ 42 and $I_a$ 44 and save as $T_{20}$,
 2. read time between waveforms $V_{bc}$ 43 and $I_c$ 45 and save as $T_{21}$,
 3. determine if $T_{20}$ or $T_{21}$ is greater,
 4. use the greater time from step 3 to determine if the current leads or lags the voltage, and
 5. calculate power factor pf magnitude from $pf=P_{av}/(1.73\ V_{rms}I_{rms})$.

F. Output Electrical Measurements
 1. output a signal proportional to $V_{rms}$ on HSO 66,
 2. output a signal proportional to $I_{rms}$ on HSO 67,
 3. output a signal proportional to $P_{av}$ on HSO 65,
 4. output a signal proportional to f on HSO 68, and
 5. output a signal proportional to pf on PWM 69,

II. Control Steps 1. determine polarity of $P_{av}$,
 2. compare negative values of $P_{av}$ with reverse power setpoint value. If it is equal or greater than, initiate control sequence,
 3. compare positive values of $P_{av}$ with forward power setpoint value. If equal or greater than, initiate control sequence,
 4. if absolute values are less than the setpoint values, no action is required unless there is already a control sequence in progress. In that event, this sequence is terminated,
 5. determine if $V_{rms}$ is over or under limits allowed in ship class. If outside the limits, initiate control sequence,
 6. determine if frequency f is over or under limits allowed in ship class. If outside the limits, initiate control sequence, and
 7. determine if frequency is below and current is above the limits allowed in ship class. If outside the limits, initiate control sequence.

III. Control Sequence

A. Reverse Power
 1. determine timing routine for particular ship class,
 2. read reverse power timing switches for Diesel-steam timing sequences,
 3. determine magnitude of $P_{av}$ with the reverse power setpoint to determine trip time, and
 4. output control signal if time out occurred.

B. Forward Power
 1. determine timing routine for particular ship class,
 2. read fixed time trip mode switch,
 3. if $P_{av}$ remains greater than forward power setpoint for longer than fixed time mode, initiate first stage trip,
 4. read variable trip time switches,
 5. if $P_{av}$ remains greater than forward power setpoint for longer than the variable time period, initiate second stage trip, and
 6. if $P_{av}$'s absolute value drops below setpoint value, re-initiate each timing sequence.

C. Under or Over Voltage
 1. determine timing routine for $V_{rms}$, and 2. if $V_{rms}$ is outside the limits put out control signal.

D. Under or Over Frequency
 1. determine timing routine for f, and
 2. if f is outside limits put out control signal.

E. Over Current and Under Frequency (Fault Current)
 1. determine timing routine for fault current, and
 2. if frequency level is low and current level is high, put out control signal.

IV. Determine Set Points 1. determine 100% power level from PL=5/CTF (PT volts 3),
 2. multiply (PL) (RPR) level switches 99 to get reverse power set point,
 3. multiply (PL) (OPR) level switches 98 to get forward power set point, and
 4. read ship class to determine under or over voltage, under or over frequency, and under frequency and over current limits.

What we claim is:

1. In a power measuring and control system (20) for measuring and controlling the output power of a multiphase AC generator (21) and its prime mover; said generator being connected in parallel with another multiphase AC generator (21') through a power bus (24) having at least three phase lines $\phi_a, \phi_b, \phi_c$ for feeding power to loads (23a–23c) through connect/disconnect means (80d–82d); each one of said generators having distinct criteria for the nominal output power, the magnitude and sign of the power factor (PF), the RMS voltage $V_{rms}$, the RMS current $I_{rms}$, and their fundamental frequency f; and said criteria having specified, allowable deviation ranges within set trigger points, the improvement comprising:

voltage sensing means (25,25') for sensing between said phases $\phi_a,\phi_b$ and $\phi_b,\phi_c$ the instantaneous sinusoidal voltage signals $V_{ab}, V_{bc}$ (30,32), respectively, having a fundamental frequency f;

current sensing means (26,26') for sensing the instantaneous sinusoidal current signals $I_a, I_c$ (33,35) in said phases $\phi_a, \phi_c$, respectively;

signal shaper means (27,28,29,50,51,54,55) for shifting, band-limiting and attenuating said instantaneous voltage and current signals and for producing therefrom: (a) corresponding attenuated sinusoidal voltage and current signals $V_{ab}, V_{bc}$ (38,39) and $I_a, I_c$ (40, 41), (b) corresponding respective, synchronized, voltage and current square-wave signals $V_{ab}, V_{bc}, I_a, I_c$ (42,43,44,45) containing information on said fundamental frequency f, and (c) a square wave signal $V_{ab}$ (46) having a fixed, high-multiple frequency of said fundamental frequency f;

said shaper means (27) having two voltage channels (28) and two current channels (29), each channel having phase-locked loops (PLL) (51) for generating from said attenuated sinusoidal signals $V_{ab}, V_{bc}, I_a, I_c$ said square wave signals $V_{ab}, V_{bc}, I_a, I_c$ (42–46);

micro-processor/micro-controller (M-P/M-C) means (22) including: an electronic read-only memory (ROM) (60), a random-access memory (RAM) (61), analog-to-digital (A/D) converter means, high-speed inputs (HSIs) for receiving said square wave signals $V_{ab}, V_{bc}, I_a, I_c$ (42–45), an external interrupt (EXINT) input for receiving said high frequency square wave signal $V_{ab}$ (46), high-speed outputs (HSOs), and hi-directional input-output (I/O) ports (P1);

a configuration network (62) coupled to said ROM (60) and to said RAM (61) through an address/data bus (63) for configuring said micro-processor/micro-controller means (22) to control the output power of its associated generator in accordance with said generation's particular criteria values and set points;

said network (62) including binary-coded rotary configuration switches, each switch being mechanically adjustable for a particular criterion value and its set points, and each switch acting as a mechanical ROM occupying memory address space in said electronic ROM and being readable as an electronic ROM;

said (A/D) converter means digitizing said attenuated sinusoidal voltage and current signals $V_{ab}, V_{bc}, I_a, I_c$ (38,39,40,41);

said M-P means (22) under the control of software
  digitizing said square wave signals $V_{ab}, V_{bc}, I_a, I_c$ (42–45) into respective digital representations thereof,
  sampling, N times per cycle, starting when said high-frequency square wave signal (46) transits from low to high, the instantaneous digital values of $v_{ab}, v_{bc}$ and of $i_a, i_c$, for each sample of said digitized sinusoidal voltage and current signals,
  calculating for each sample the instantaneous power $p_{as}$ in said phase $\phi_a$ from $p_{as}=(v_{ab}i_a)$ and the instantaneous power $p_{cs}$ in said phase $\phi_c$ from $p_{cs}=(v_{bc}i_c)$,
  calculating the mean power per cycle $p_{am}$/cyc in said phase $\phi_a$ from $p_{am}/\text{cyc}=\Sigma p_{as}/N$, the mean power per cycle $p_{cm}$/cyc in said phase $\phi_c$ from $p_{cm}/\text{cyc}=\Sigma p_{cs}/N$, and the resultant mean power per cycle of $P_m$/cyc from $P_m/\text{cyc}=p_{am}+p_{cm}$,
  digitally calculating
   1) the root-mean-square RMS value of the voltage per cycle between
    (a) said phases $\phi_a, \phi_b$ from $v_{abrms}/\text{cyc}=\sqrt{\Sigma v_{ab}^2/N}$,
    (b) said phases $\phi_b, \phi_c$ from $v_{bcrms}/\text{cyc}=\sqrt{\Sigma v_{bc}^2/N}$,
   2) the root-mean-square RMS value of the current per cycle in
    (a) said phase $\phi_a$ from $i_{amrms}/\text{cyc}=\sqrt{\Sigma i_a^2/N}$,
    (b) said phase $\phi_c$ from $i_{cmrms}/\text{cyc}=\sqrt{\rho i_c^2/N}$,
   3) the mean root-mean-square RMS value of the voltage per cycle on said bus from $V_{mrms}/\text{cyc}=(Y_{abrms+vbcrms})/2$,
   4) the mean root-mean-square RMS value of the current per cycle in said bus from $I_{mrms}/\text{cyc}=(i_{arms}+i_{crms})/2$, and
   5) the power factor value per cycle in said bus from $PF/\text{cyc}=P_m/(1.73\ V_{mrms} \times I_{mrms})$, said PF/cyc being positive (+) when said square wave signals $I_a, I_c$ (40,41) lead said square wave signals $V_{ab}, V_{bc}$ (38,39), respectively, and, conversely, said PF/cyc being negative (−) when said square wave signals $I_a, I_c$ (40,41) lag said square wave signals $V_{ab}, V_{bc}$;

said (M-P/M-C) means (22) being, in use, under the control of said software and of said settings on said configuration switches for continuously digitally comparing one or more of said measured components of power, including: said instantaneous phase powers $p_a$ and $p_c$, said mean power per cycle $P_m$, said phase RMS voltages per cycle $v_{abrms}$ and $v_{bcrms}$, said mean RMS voltage per cycle $v_{mrms}$, said RMS phase currents per cycle $I_{amrms}$ and $I_{cmrms}$, said mean RMS current per cycle $I_{mrms}$, and said power factor per cycle PF and its sign (+/−), against their corresponding comparable criteria values stored in said electronic ROM, and when the result of such comparison yields a result which is either under or over one of said stored set point values in said ROM, said M-C means is triggered to output from said I/O bi-directional ports a digital control signal tripping, in a timely fashion, one or more of said connect/disconnect means (80d–82d) thereby causing appropriate successive sheddings of said loads from said bus or, if said load sheddings are insufficient, to completely break the tie between the controlled overloaded generator (21) and said power bus (24) so as to reduce from said overloaded generator a temporary, excessive, high-power load demand, and protecting the remaining generator (21') and its prime mover; and adjustable delay means for delaying said load sheddings by discrete time intervals before generating said control signals.

2. The system according to claim 1, wherein said M-P means (22) has a pulse-width modulated (PWM) output;

said high-speed outputs (HSOs) are pulse-width modulated (PWM) square wave signals (65–68), and said PWM output from said M-P means is a PWM square wave signal (69) having a higher frequency than the frequency of said HSOs; and a plurality of distinct optocoupler (OC) DC circuits (70) having DC current meters (65'–69'); and each one of said PWM square wave signals (65–69), as it passes through its corresponding OC circuit (70) and its said DC current meter, becomes converted into a proportional, isolated, 4–20 ma DC current signal, thereby providing readings of mean output power $P_m$ in kW/cyc (65'), mean RMS voltage per cycle $V_{mrms}$ in volts/cyc (66'), mean RMS current per cycle $I_{mrms}$ in amps/cyc (67'), fundamental frequency f in Hz (68'), and power factor PF/cyc (69'), respectively.

3. The system according to claim 1, and a computer means;

said M-P has a communication port P2; and said M-P means (22) communicates through its said port P2 with said computer means for carrying out diagnostics and testing on said generator (21) and/or its said loads.

4. The control system according to claim 3, wherein said connect/disconnect means are electrically-operated circuit breakers (80d–82d); and said digital control signals from said I/O bi-directional ports P1 activate appropriate ones of said circuit breakers to cause said successive sheddings of said loads from said bus, or to completely break the tie between said power bus (24) and said overloaded generator (21).

5. The system according to claim 1, and visual indication means responsive to said output control signals for indicating the status of said generator and its said loads by turning on light-emitting diodes (LED) indicative of said tripped conditions of said connect-disconnect means, or that said set points have been reached, or that a particular load has been shed.

6. In a method for measuring and controlling the output power of a multiphase AC generator (21) and its prime mover, said generator being connected in parallel with another multiphase AC generator (21') through a power bus (24) having at least three phase lines $\phi_a,\phi_b,\phi_c$ for feeding power to loads (23a–23c) through connect/disconnect means (80d–82d), each one of said generators having distinct criteria for the nominal output power, the magnitude and sign of the power factor (PF), the RMS voltage $V_{rms}$, the RMS current $I_{rms}$, and their fundamental frequency f, and said criteria having specified, allowable deviation ranges within set trigger points, the improvement comprising:

sensing (25,25') the sinusoidal voltage signals, having said fundamental frequency f, between said phases $\phi_a,\phi_b$ and $\phi_b,\phi_c$, and producing raw sinusoidal voltage signals $V_{ab},V_{bc}$ (30,32), respectively;

sensing (26,26') the sinusoidal current signals in said phases $\phi_a,\phi_c$ and producing raw sinusoidal current signals $I_a,I_c$ (33, 35), respectively;

shaping (27,28,29,50,51,54,55) by shifting, band limiting, and attenuating said raw voltage signals $V_{ab},V_{bc}$ and said raw current signals $I_a,I_c$, and producing therefrom corresponding attenuated sinusoidal voltage and current signals $V_{ab},V_{bc},I_a,I_c$ (38,39,40,41);

using phase-locked loops (PLL) (51) for generating corresponding, respective, synchronized, voltage and current square-wave signals $V_{ab},V_{bc},I_a,I_c$ (42,43,44,45), containing information on said fundamental frequency f, and a square wave signal $V_{ab}$ (46) having a fixed, high-multiple frequency of said fundamental frequency f;

using under the control of software a micro-processor/micro-controller (M-P/M-C) means (22) including: an electronic read-only memory (ROM) (60), a random-access memory (RAM) (61), analog-to-digital (A/D) converter means, high-speed inputs (HSIs) for receiving said square wave signals $V_{ab},V_{bc},I_a,I_c$ (42–45), an external interrupt (EXINT) input for receiving said high frequency square wave signal $V_{ab}$ (46), high-speed outputs (HSOs), hi-directional input-output (I/O) ports (P1), a configuration network (62) coupled to said ROM (60) and to said RAM (61) through an address/data bus (63) for configuring said micro-processor/micro-controller means (22) to control the output power of its associated generator in accordance with said generator's particular criteria values and set points, said network including binary-coded rotary configuration switches, each switch being mechanically adjustable for a particular criterion value and its set points, and each switch acting as a mechanical ROM occupying memory address space in said electronic ROM and being readable as an electronic ROM;

using said (A/D) converter means to digitize said attenuated sinusoidal voltage and current signals $V_{ab},V_{bc},I_a,I_c$ (38,39,40,41) into corresponding digital representations thereof;

using said M-P means (22) to digitize said square wave signals $V_{ab},V_{bc},I_a,I_c$ (42–46) into respective digital representations thereof containing information on said power factor's direction and on said fundamental frequency f of said raw voltage signal $V_{ab}$ (30);

using said M-P means (22) to digitally measure for each sample, N times per cycle, starting when said high-frequency square wave signal (46) transits from low to high, the instantaneous values $v_{ab},v_{bc}$ of said attenuated sinusoidal voltage signals $V_{ab},V_{bc}$ (38,39), and the instantaneous values $i_a,i_c$ of said attenuated sinusoidal current signals $I_a,I_c$ (40,41), digitally calculate for each sample the instantaneous power $p_{as}$ in said phase $\phi_a$ from $p_{as}=(v_{ab}i_a)$ and the instantaneous power $p_{cs}$ in said phase $\phi_c$ from $P_{cs}=(V_{bc}i_c)$, digitally calculate the mean power per cycle $p_{am}$/cyc in said phase $\phi_a$ from $p_{am}$/cyc=$\Sigma p_{as}$/N, the mean power per cycle $p_{cm}$/cyc in said phase $\phi_c$ from $p_{cm}$/cyc=$\Sigma p_{cs}$/N, and the resultant mean power per cycle of $P_m$/cyc from $P_m$/cyc=$p_{am}$+$p_{cm}$, digitally calculate
1) from said instantaneous voltages $v_{ab}$,$v_{bc}$ and said instantaneous currents $i_a$,$i_c$, the root-mean-square RMS value of the voltage per cycle between (a) said phases $\phi_a$,$\phi_b$ from $v_{abrms}$/cyc=$\sqrt{\Sigma v_{ab}^2/N}$, (b) said phases $\phi_b$,$\phi_c$ from $v_{bcrms}$/cyc=$\sqrt{\Sigma v_{bc}^2/N}$, 2) the root-mean-square RMS value of the current per cycle in (a) said phase $\phi_a$ from $i_{amrms}$/cyc=$\sqrt{\Sigma i_a^2/N}$, (b) said phase $\phi_c$ from $i_{cmrms}$/cyc=$\sqrt{\Sigma i_c^2/N}$, 3) the mean root-mean-square RMS value of the voltage per cycle on said bus from $V_{mrms}$/cyc= $(v_{abrms}+v_{bcrms})/2$, 4) the mean root-mean-square RMS value of the current per cycle in said bus from $I_{mrms}$/cyc= $(i_{arms}+i_{crms})/2$, and 5) the power factor value per cycle in said bus from PF/cyc=$P_m$/(1.73 $V_{mrms} \times I_{mrms}$), said PF/cyc being positive (+) when said square wave signals $I_a$,$I_c$ (40,41) lead said square wave signals $V_{ab}$,$V_{bc}$ (38,39), respectively, and, conversely, said PF/cyc being negative (−) when said square wave signals $I_a$,$I_c$ (40,41) lag said square wave signals $V_{ab}$,$V_{bc}$;

using said (M-P/M-C) means (22), under the control of said software and of said settings on said configuration switches, to continuously digitally compare one or more of said measured components of power, including: said instantaneous phase powers $p_a$ and $p_c$, said mean power per cycle $P_m$, said phase RMS voltages per cycle $v_{abmrms}$ and $v_{bcmrms}$, said mean RMS voltage per cycle $V_{mrms}$, said RMS phase currents per cycle $I_{ammrms}$ and $I_{cmrms}$, said mean RMS current per cycle $I_{mrms}$, and said power factor per cycle PF and its sign (+/−), against their corresponding comparable criteria values stored in said electronic ROM, and when the result of such comparison yields a result, which is either under or over one of said stored set point values in said ROM, to trigger said M-C means to output from said I/O bi-directional ports a digital control signal for tripping, in a timely fashion, one or more of said connect/disconnect means (80d–82d) thereby to cause appropriate successive sheddings of said loads from said bus or, if said load sheddings are insufficient, to completely break the tie between the controlled overloaded generator (21) and said power bus (24), so as to reduce from said overloaded generator a temporary, excessive, high-power load demand, and protecting the remaining generator (21') and its prime mover; and adjustably delaying said load sheddings by discrete time intervals before generating said control signals.

7. The method according to claim 6, wherein said connect/disconnect means are electrically-operated circuit breakers (80d–82d); and using said digital control signals from said I/O bi-directional ports P1 to activate appropriate ones of said circuit breakers to cause said successive sheddings of said loads from said bus, or to completely break the tie between said power bus (24) and said overloaded generator (21).

8. The method according to claim 6, and using said digital control signals to visually indicate the status of said generator and of its said loads.

9. In a method for measuring and controlling the output power of a multiphase AC generator (21) and its prime mover, said generator being connected in parallel with another multiphase AC generator (21') through a power bus (24) having at least three phase lines $\phi_a$,$\phi_b$,$\phi_c$ for feeding power to loads (23a–23c) through connect-disconnect means (80d–82d), each one of said generators having distinct criteria for the nominal output power, the magnitude and sign of the power factor (PF), the RMS voltage $V_{rms}$, the RMS current $I_{rms}$, and their fundamental frequency f, and said criteria having specified, allowable deviation ranges within set trigger points, the improvement comprising:

sensing (25,25') the sinusoidal voltage signals, having said fundamental frequency f, between said phases $\phi_a$,$\phi_b$ and $\phi_b$,$\phi_c$ and producing raw sinusoidal voltage signals $V_{ab}$,$V_{bc}$ (30,32), respectively;

sensing (26,26') the sinusoidal current signals in said phases $\phi_a$,$\phi_c$ and producing raw sinusoidal current signals $I_a$,$I_c$ (33,35), respectively;

shaping (27,28,29,50,51,54,55) by shifting, band limiting, and attenuating said raw voltage signals $V_{ab}$,$V_{bc}$ and said raw current signals $I_a$,$I_c$, and producing therefrom corresponding attenuated sinusoidal voltage and current signals $V_{ab}$,$V_{bc}$,$I_a$,$I_c$ (38,39,40,41);

using phase-locked loops (PLL) (51) for generating corresponding, respective, synchronized, voltage and current square-wave signals $V_{ab}$,$V_{bc}$,$I_a$,$I_c$ (42,43,44,45), containing information on said fundamental frequency f, and a square wave signal $V_{ab}$ (46) having a fixed, high-multiple frequency of said fundamental frequency f;

using under the control of software a microprocessor (M-P) means (22) including: an electronic read-only memory (ROM) (60), a random-access memory (RAM) (61), analog-to-digital (A/D) converter means, high-speed inputs (HSIs) for receiving said square wave signals $V_{ab}$,$V_{bc}$,$I_a$,$I_c$ (42–45), an external interrupt (EXINT) input for receiving said high frequency square wave signal $V_{ab}$ (46), high-speed outputs (HSO), bi-directional input-output (I/O) ports (P1);

using said (A/D) converter means to digitize said attenuated sinusoidal voltage and current signals $V_{ab}$,$V_{bc}$,$I_a$,$I_c$ (38,39,40,41) into corresponding digital representations thereof;

using said M-P means (22) to digitize said square wave signals $V_{ab}$,$V_{bc}$,$I_a$,$I_c$ (42–46) into respective digital representations thereof containing information on said power factor's direction and on said fundamental frequency f of said raw voltage signal $V_{ab}$ (30);

using said M-P means (22) to digitally measure for each sample, N times per cycle, starting when said high-frequency square wave signal (46) transits from low to high, the instantaneous values $v_{ab}$,$v_{bc}$ of said attenuated sinusoidal voltage signals $V_{ab}$,$V_{bc}$ (38,39), and the instantaneous values $i_a$,$i_c$ of said attenuated sinusoidal current signals $I_a$,$I_c$ (40,41), digitally calculate for each sample the instantaneous power $P_{as}$ in said phase $\phi_a$ from $p_{as}$=($v_{ab}i_a$) and the instantaneous power $P_{cs}$ in said phase $\phi_c$ from $p_{cs}$=($v_{bc}i_c$), digitally calculate the mean power per cycle $p_{am}$/cyc in said phase $\phi_a$ from $p_{am}$/cyc=$\Sigma p_{as}$/N, the mean power per cycle $p_{cm}$/cyc in said phase $\phi_c$ from $p_{cm}$/cyc=

$\Sigma p_{cs}/N$, and the resultant mean power per cycle of $P_m$/cyc from $P_m/\text{cyc}=p_{am}+p_{cm}$, digitally calculate from said instantaneous voltages $V_{ab},V_{bc}$ and said instantaneous currents $i_a,i_c$, 1) the root-mean-square RMS value of the voltage per cycle between (a) said phases $\phi_a,\phi_b$ from $v_{abrms}/\text{cyc}=\sqrt{\Sigma v_{ab}^2/N}$, (b) said phases $\phi_b,\phi_c$ from $v_{bcrms}/\text{cyc}=\sqrt{\Sigma v_{bc}^2/N}$, 2) the root-mean-square RMS value of the current per cycle in (a) said phase $\phi_a$ from $i_{arms}/\text{cyc}=\sqrt{\Sigma i_a^2/N}$, (b) said phase $\phi_c$ from $i_{crms}/\text{cyc}=\sqrt{\Sigma i_c^2/N}$, 3) the mean root-mean-square RMS value of the voltage per cycle on said bus from $V_{mrms}/\text{cyc}=(v_{abrms}+v_{bcrms})/2$, 4) the mean root-mean-square RMS value of the current per cycle in said bus from $I_{mrms}/\text{cyc}=(i_{arms}+i_{crms})/2$, and 5) the power factor value per cycle in said bus from $PF/\text{cyc}=P_m/(1.73\ V_{mrms}\times I_{mrms})$, said PF/cyc being positive (+) when said square wave signals $I_a,I_c$ (40,41) lead said square wave signals $V_{ab},V_{bc}$ (38,39), respectively, and, conversely, said PF/cyc being negative (−) when said square wave signals $I_a,I_c$ (40,41) lag said square wave signals $V_{ab},V_{bc}$;

said M-P means (22) having a pulse-width modulated (PWM) output which outputs a PWM square wave signal (69) having a higher frequency than the frequency of said HSOs outputs;

said high-speed outputs (HSOs) output pulse-width modulated (PWM) square wave signals (65–68); and using a plurality of distinct optocoupler (OC) DC circuits (70), having DC current meters (65'–69') therein, for passing each one of said PWM square wave signals (65–69) through a corresponding OC circuit (70) to obtain a proportional, isolated, 4–20 ma DC current signal flowing through one of said meters (65'–69') thereby providing readouts for mean output power $P_m$ in kW/cyc (65'), mean RMS voltage per cycle $V_{mrms}$ in volts/cyc (66'), mean RMS current per cycle $I_{mrms}$ in amps/cyc (67'), frequency f in Hz (68'), and power factor PF/cyc (69'), respectively.

10. A method for measuring the mean power per cycle $P_m$/cyc and the components thereof in a multiphase AC bus (24) having at least three phase lines $\phi_a,\phi_b,\phi_c$, comprising:

sensing (25,25') the sinusoidal voltage signals having a fundamental frequency f between said phases $\phi_a$, $\phi_b$ and $\phi_b$, $\phi_c$ and producing raw sinusoidal voltage signals $V_{ab},V_{bc}$ (30,32), respectively;

sensing (26,26') the sinusoidal current signals in said phases $\phi_a,\phi_c$ and producing raw sinusoidal current signals $I_a,I_c$ (33,35), respectively;

shaping (27,28,29,50,51,54,55) by shifting, band limiting, and attenuating said raw voltage signals $V_{ab},V_{bc}$ and said raw current signals $I_a,I_c$, and producing therefrom corresponding attenuated voltage signals $V_{ab},V_{bc}$ (38, 39), corresponding attenuated current signals $I_a,I_c$ (40,41), corresponding square wave signals $V_{ab},V_{bc},I_a,I_c$ (42, 43,44,45), synchronized with said raw signals $V_{ab}$, $V_{bc},I_a,I_c$, respectively, and a square wave signal $V_{ab}$ (46) whose frequency is a fixed high multiple of said fundamental frequency f;

using a micro-processor (M/P) means (22) including an electronic read-only memory (ROM) (60), a random-access memory (RAM) (61), analog-to-digital (A/D) converter means, high-speed inputs (HSIs) for receiving said square wave signals $V_{ab},V_{bc},I_a,I_c$ (42–45), an external interrupt (EXINT) input for receiving said high frequency square wave signal $V_{ab}$ (46), high-speed outputs (HSOs), hi-directional input-output (I/O) ports (P1), and a communication port P2;

using said (A/D) converter means to digitize said attenuated voltage signals $V_{ab},V_{bc}$ (38,39) and said attenuated current signals $I_a,I_c$ (40,41) into corresponding digital representations thereof;

using a micro-processor (M/P) means to digitize said square wave signals (42–46) into corresponding digital representations thereof that contain information on said fundamental frequency of said raw sinusoidal voltage signal $V_{ab}$ (30);

using said M/P means to digitally measuring for each sample, N times per cycle, starting when said high-frequency square wave signal (46) transits from low to high, the instantaneous values $v_{ab},v_{bc}$ of said attenuated sinusoidal voltage signals $V_{ab},V_{bc}$ (38,39), and the instantaneous values $i_a,i_c$ of said attenuated sinusoidal current signals $I_a,I_c$ (40, 41), and digitally calculating for each sample the instantaneous power $p_{as}$ in said phase $\phi_a$ from $p_{as}=(v_{ab}i_a)$ and the instantaneous power $p_{cs}$ in said phase $\phi_c$ from $p_{cs}=(v_{bc}i_c)$, and calculating the mean power per cycle $p_{am}$/cyc in said phase $\phi_a$ from $p_{am}/\text{cyc}=\Sigma p_{as}/N$, the mean power per cycle $p_{cm}$/cyc in said phase $\phi_c$ from $p_{cm}/\text{cyc}=\Sigma p_{cs}/N$, and the resultant mean power per cycle of $P_m$/cyc from $P_m/\text{cyc}=p_{am}+p_{cm}$; and using a computer means to communicate with said M/P means (22) through its said port P2 for carrying out diagnostics and testing on said generators and/or their said loads.

\* \* \* \* \*